United States Patent [19]
Dominguez et al.

[11] Patent Number: 4,610,030
[45] Date of Patent: Sep. 2, 1986

[54] FREQUENCY MODULATED TRANSMITTER APPLICABLE TO MF BROADCASTING

[75] Inventors: Mariano Dominguez, La Courneuve; Daniel Artaud, Chatou, both of France

[73] Assignee: Thomson-LGT, Chatou, France

[21] Appl. No.: 667,922

[22] Filed: Nov. 2, 1984

[30] Foreign Application Priority Data
Nov. 4, 1983 [FR] France .................. 83 17590

[51] Int. Cl.$^4$ .............................................. H04B 1/04
[52] U.S. Cl. ................................... 455/113; 455/119; 455/126; 331/23
[58] Field of Search ............... 455/113, 119, 110, 126, 455/24; 331/23, 25

[56] References Cited

U.S. PATENT DOCUMENTS

| 3,392,347 | 9/1965 | Baylor et al. ................... 331/25 |
| 3,593,182 | 7/1971 | Wheaton ........................... 331/25 |
| 3,644,831 | 10/1977 | Collins . |
| 4,053,933 | 2/1972 | Latker et al. . |
| 4,282,497 | 8/1981 | Hulbert ............................. 455/126 |

FOREIGN PATENT DOCUMENTS

2703566 8/1977 Fed. Rep. of Germany .
2230117 12/1974 France .

OTHER PUBLICATIONS

Archer et al., "A Broad-Band UHF Mixer Exhibiting High Image Rejection over a Multi-Decade Baseband Frequency Range," *IEEE, Journal of Solid-State Circuits*, vol. SC-18, No. 4, Aug. 4, 1981, pp. 385-392.

Okano, et al., "Crystal Oscillators Facilitate Future Frequency Control," *J.E.E., Journal Electronic Engineering*, No. 144, Dec. 1978, pp. 40-43.

*Primary Examiner*—Jin F. Ng
*Assistant Examiner*—Elissa Seidenglanz
*Attorney, Agent, or Firm*—Pollock, VandeSande & Priddy

[57] ABSTRACT

The invention concerns a frequency modulation broadcasting transmitter in which the output oscillator at the transmission frequency is modulated not directly by the audiofrequency signal but through the intermediary of a phase locking loop comprising a phase comparator supplied, on the one hand, by the output signal filtered from a picture or image frequency rejection mixer. This mixer receives, on the one hand, a modulated intermediary frequency signal from a modulator and, on the other hand, the output signal of the oscillator at the transmitting frequency $F_S$, the reference frequency $F_{o1}$ being determined as a function of the central transmitting frequency and of the intermediary frequency $F_{o1} = F_S - F_i$.

6 Claims, 5 Drawing Figures

FREQUENCY MODULATED TRANSMITTER APPLICABLE TO MF BROADCASTING

FIELD OF THE INVENTION

The present invention concerns frequency modulated transmitters, especially for frequency modulated broadcasting.

DESCRIPTION OF THE PRIOR ART

Most frequency modulated broadcasting transmitters, or emitters, use an oscillator at the output channel frequency. This oscillator comprises a Varicap diode modulated in accordance with the rhythm of the modulated broadcasting signal. In present day transmitters, the central frequency is maintained stable by using a phase locking loop comprising a quartz reference oscillator. In this type of emitters, performances remain limited, in particular due to noise characteristics; indeed, for an LC type oscillator comprising an inductance coil and a capacitor, the noise increases with the frequency and the noise level, for a directly modulated radio frequency oscillator cannot be lower than a threshold of about −65 dB with respect to the carrier frequency. Furthermore, an oscillator linearization circuit is often necessary in order to maintain constant the frequency swing due to modulation as a function of the output channel frequency. Furthermore, the modulation possibility of this oscillator at lower frequencies renders it sensitive to mechanical or microphonic effects. Consequently, effective insulation against vibrations is necessary.

Other transmission systems use a lower modulated frequency, called intermediary frequency, that allows the reduction of noise. The signal thus modulated is thereafter multiplied or transposed in frequency by mixing in order to obtain the signal at the desired transmission frequency. These systems have the drawback of generating interference signals, in particular harmonic signal frequencies or effects of frequency beat. These signals are prejudicial since they can disturb a receiver tuned to another channel or interfere with other broadcasting services. Very strict legal or similar provisions establish the maximum level of such interference signals.

Furthermore, the increase of the transmission density in frequency modulation as well as the utilization of broadcasting sources and very high fidelity receivers lead to seeking, independently of the problems cited hereinabove, the improvement of transmitting equipment performances.

SUMMARY OF THE INVENTION

The transmitter proposed hereinbelow improves the performances of frequency modulation transmitting equipment, while overcoming the drawbacks of a conventional transmitter operating in the intermediary frequency modulation range and reducing the noise which would be obtained in a direct modulation type transmitter at transmission frequency.

According to the invention, in a modulation frequency transmitter comprising an output oscillator centered on the central frequency $F_S$ of the transmission channel, having at least one modulation input of the transmission frequency, a modulation signal is applied to this modulation input through the intermediary of a phase locking loop comprising, in series between the output and the input of modulation of the output oscillator, a mixer of which a first input is connected to the output of the oscillator and of which a second input is connected to the output of an intermediary frequency $F_i$ modulator receiving the modulation signal, a waveband filter having a band equal to the shifted MF band of the central frequency $F_i$ of the intermediary frequency modulator, an analog phase comparator one input of which is connected to the output of the filter, and the other input of which is connected to a stable reference frequency generator $F_{o1}$, said reference frequency being equal to a beat frequency between the average transmitting frequency and the intermediary frequency, and a low-pass filter the output of which is connected to the modulation input of the oscillator.

BRIEF DESCRIPTION OF THE DRAWINGS

The invention will be better understood and other objects, features and advantages will become more apparent by reading the following description, given with reference to the appended figures in which.

DESCRIPTION OF THE PREFERRED EMBODIMENTS

In order to obtain the advantages resulting from direct modulation at the transmitting frequency while maintaining the noise level at a value lower than the admissible level, the transmitter according to the invention utilizes a voltage controlled oscillator operating at the transmitting frequency, associated to an analog phase locking loop, the modulation being applied not directly to the control input of the oscillator at the transmitting frequency, but through the intermediary of a rejection mixer placed in the phase locking loop which receives, on the one hand, a fraction of the output signal of the voltage controlled oscillator, and, on the other hand, the output signal of an intermediary frequency modulator.

Figure 1:
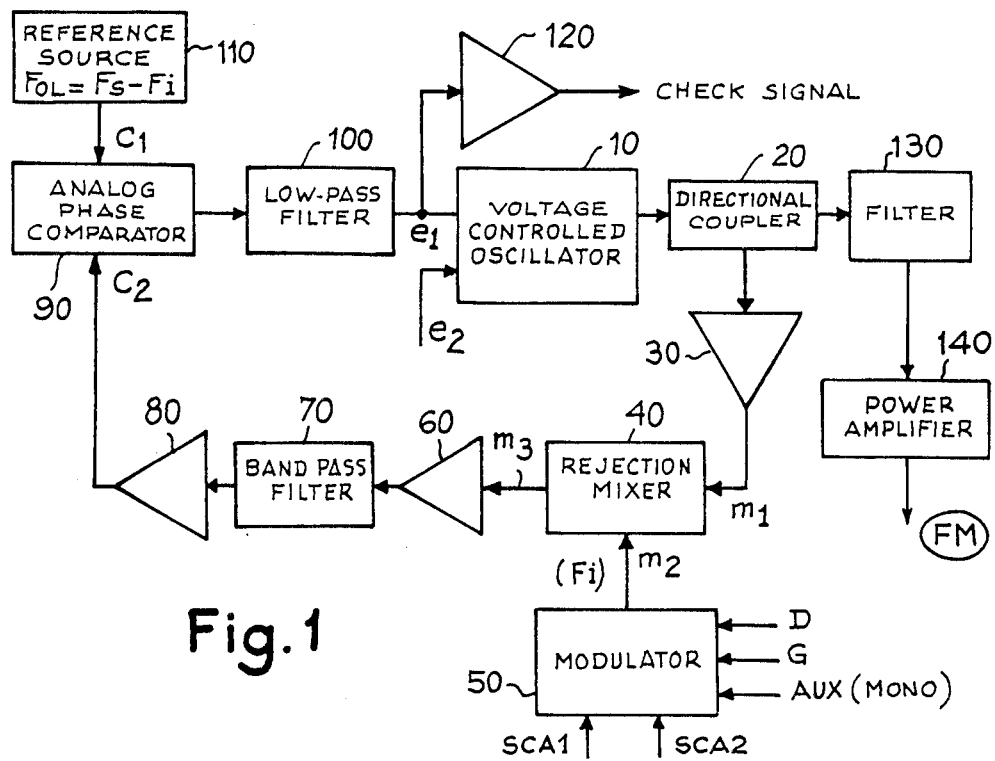
FIG. 1 is a block diagram of a first embodiment of the broadcasting transmitter at modulation frequency according to the invention.

The broadcasting frequency modulation transmitter according to the invention is described hereinbelow with reference to FIG. 1: the transmitter comprises a voltage controlled oscillator 10, of the LC type, comprising a modulation input $e_1$ acting on the varicap diodes, and allowing a modulation without amplitude or signal phase distortion at the emission frequency using monophonic or stereophonic signals. This oscillator is linear within a wide band. The oscillator 10 further comprises a frequency control input $e_2$ using also the varicap system and allowing to change the output frequency of the oscillator.

An analog phase locking loop is associated to this oscillator 10: a directional coupler 20, placed at its output, allows to pick up part of the signal at its output in order to feed an amplifier 30 the output of which is connected to a first input $m_1$ of a mixer 40 rejecting the image frequency. The amplifier 30 acts as an insulator to prevent the interference frequencies of mixer 40 from returning to output oscillator 10. The mixer also has a second input $m_2$ connected to the output of an intermediary frequency modulator 50. The intermediary frequency modulator 50 comprises two modulation inputs D, G for left and right stereophonic signal channels, an "AUX" input adapted to receive a monophonic or stereophonic signal, and two inputs $SCA_1$ and $SCA_2$ for possibly transmitting other additional signals. The modulator at intermediary frequency 50 is of the direct modulation frequency type. It will be described hereinbelow with reference to FIG. 2. The output of the rejection mixer 40 supplies the frequency modulated signal resulting from the beat or from the mixing of the frequency modulated signal at intermediary frequency $F_i$, issuing from the modulator 50 with the frequency modulated signal at transmitting frequency $F_S$, issuing from the voltage controlled oscillator 10. This rejection mixer at the image or picture frequency has the characteristic of attenuating one of the beat frequencies with respect to the other; $F_S+F_i$ is attenuated by about 20 decibels with respect to $F_S-F_i$. This allows to eliminate the locking possibility of the output locking oscillator at the undesired beat frequency, or $F_S+F_i$ in the example cited herein-above.

The output of the mixer is connected to the input of an amplifier 60 the output of which is connected to a wave-band, i.e. bond pass, filter 70. The wave-band of this filter is determined by the variation range of the beat frequency $F_m=F_S-F_i$ at output of the mixer 40. The width of this band is slightly larger than that of the band FM, $B_{FM}$, reserved for frequency modulation ($B_{FM}=108-87.5=20.5$ MHz in France). The output of this filter 70 is connected to the input of an adapter amplifier 80 the output of which is connected to an input $C_2$ of an analog phase comparator 90. This comparator is a diode comparator having, furthermore, another input $C_1$ receiving a reference frequency $F_{o1}=F_S-F_i$, determined by the selected transmitting frequency. This reference frequency issues from a reference source 110 that can be a frequency synthesizer, or a quartz oscillator, or an assembly of oscillators associated to a synthesizer and controlled by a switching system so as to select the reference frequency among a certain number of frequencies, for each of the output channels.

The phase comparator output 90 is connected to the input of a low-pass filter 100 called "loop filter" the output of which is connected to the modulation input $e_1$ of the oscillator 10. An amplifier 120 is mounted in parallel with the output of the filter 100 to check the effective presence of the signal. If one of the elements were defective, the output signal of this amplifier 120 would be disturbed. Furthermore, the principal output of the coupling 20 is connected to a filter 130 followed by a power amplifier 140.

Figure 2:
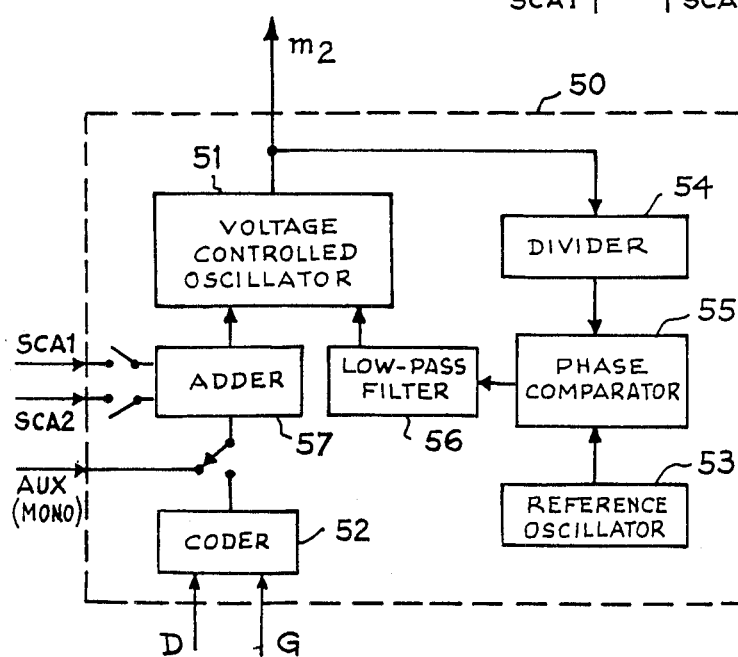
FIG. 2 is a detailed diagram of the intermediary frequency modulator utilized in the transmitter according to the invention.

FIG. 2 represents in detail the intermediary frequency modulator 50. It comprises a voltage controlled oscillator 51, with inductance and capacitor LC, the frequency of which is adjustable through the intermediary of varactors. A control input of oscillator 51 receives the modulation signal issuing from an adder 57 having two inputs connected to the inputs $SCA_1$ and $SCA_2$ and one input connected either to the output of a coder 52 receiving the stereophonic signals D, G or at the monophonic input SET (MONO). Furthermore, to obtain the stability of the average frequency of the oscillator, a phase locking loop utilizing a quartz reference oscillator is provided. With this aim, the output of oscillator 51 is connected to the input of a divider 54 that divides the output frequency of the oscillator 51 by n, n being a predetermined integer. The output of divider 54 is connected to the first input of a phase comparator 55 that receives on its second input the output signal of a quartz reference oscillator 53. The output of the phase comparator is connected to the input of a low-pass filter 56, the output of which is connected to a second control input of oscillator 51. Reference oscillator 53 has a frequency equal to the average frequency of the voltage controlled oscillator $F_i$ divided by n, the division by n being made in order to reduce phase swing corresponding to the frequency swing at low frequencies. Therefore, intermediary frequency modulator 50 operates substantially at a low fixed frequency $F_i$ with $F_i$ equal to about 10.7 MHz for example, the average value of which is perfectly stabilized by the phase locking loop. Due to the fact that the frequency modulation is realized directly on an oscillator, but at intermediary frequency, i.e. at a lower frequency than the transmitting frequency, the level of the residual noise is lower than that of an oscillator directly modulated at the output frequency. For example, the noise can be held in such an intermediary frequency oscillator at a value of 90 decibels less than the useful signal.

Figure 3:
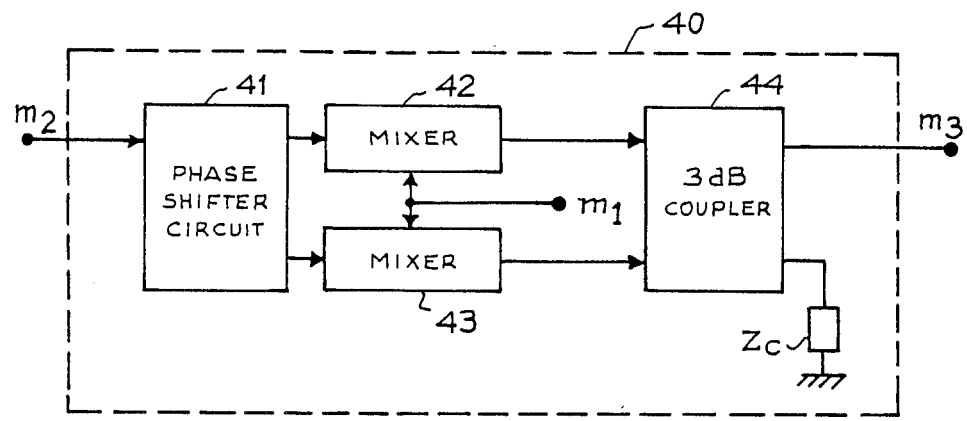
FIG. 3 is a detailed diagram of the rejection mixer utilized in this transmitter.

The rejection mixer of the second-channel frequency 40 is represented in detail in FIG. 3. It comprises a phase shifter circuit 41 receiving on its first input terminal $m_2$ the signal at intermediary frequency, the frequency being modulated by the audiofrequency signal $S_{50}$, this signal being decomposed into two coordinates in quadrature. The two outputs of phase shifter 41 are respectively connected to the first inputs of the two mixers 42 and 43 receiving at their second inputs the signal at the transmitting frequency $S_{30}$, picked up by the directional coupler 20 at the output of the voltage controlled oscillator of the principal loop 10. The two outputs of the mixers 42 and 43 are connected to two inputs of a 3 dB coupler 44 that supplies the total of the signals applied to its two inputs to an output terminal $S_{40}$, the fourth terminal being closed on the characteristic impedance $Z_c=50$ ohms.

Figure 4:
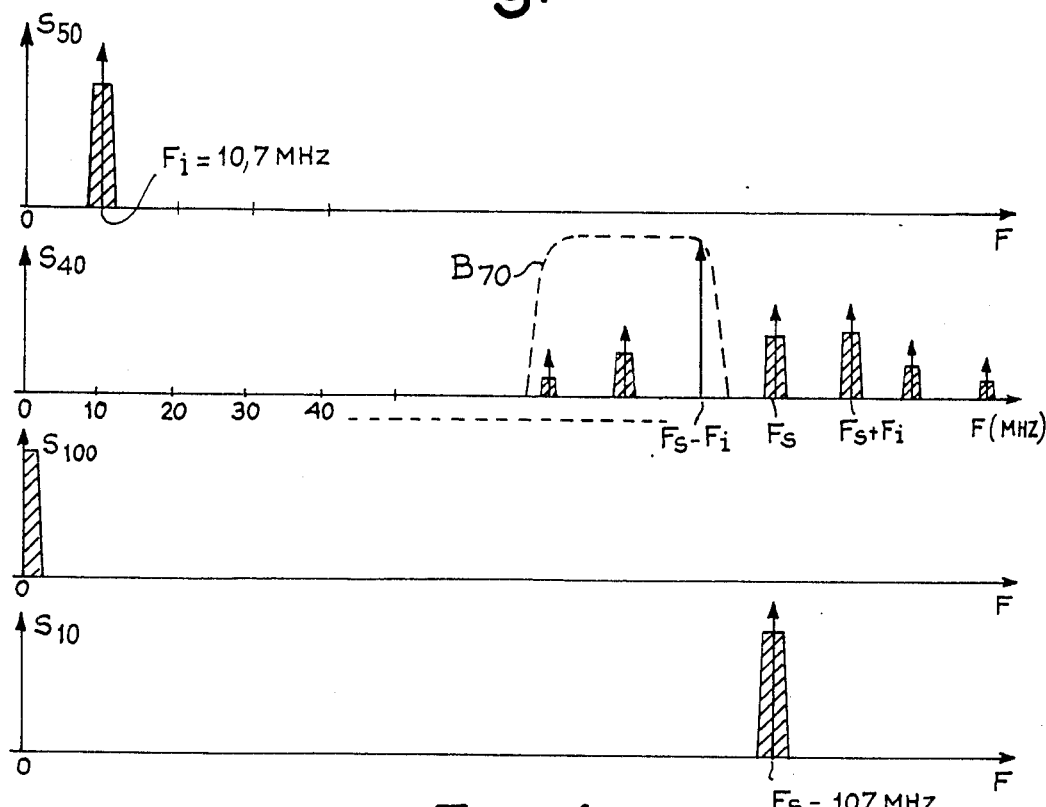
FIG. 4 represents the spectra of certain signals in the transmitter according to the invention with automatic digital positioning loop and frequency holding circuit.

FIG. 4, which represents spectra of the signals in certain points of the transmitter, will render more apparent its operation. Signal $S_{50}$ at the output of the modulator is the signal at intermediary frequency modulated by the audiofrequency signal. Its spectrum is represented in FIG. 4. The output signal of this modulator 50 is, as indicated hereinabove, applied to the first input of the rejection mixer of the second-channel frequency 40, the other input of the mixer receives the output signal at the transmitting frequency $F_S$. The average transmitting frequency can be, for a given channel, equal to 107 MHz. The output $S_{40}$ of this rejection mixer supplies a signal comprising a certain number of spectrum-lines resulting from the mixing of frequency $F_i$ and frequency $F_S$, $F_S-F_i$, $F_S$, $F_S+F_i$, etc.; due to the principle of the rejection mixer one of the beat frequencies, or $F_S+F_i$ is attenuated with respect to the other, by about 20 decibels. In the example represented in FIG. 4, the spectrum-line $F_S-F_i$ has in fact been selected, since it allows to maintain the modulation direction and to utilize a reference frequency that is lower and therefore of better quality. Prior to the locking of the loop all the spectrum-lines resulting from the mixing of $F_S$ and $F_i$ are modulated like signal $F_i$ applied to the first input. After locking, the modulation of the spectrum-line $F_S-F_i$ disappears. The wave-band filter 70 placed at the output of the rejection mixer 40 is able to filter all the modulated spectrum-lines resulting from the mixing and situated outside the MF band, shifted by $-F_i$. This filter 70 contributes to attenuate the interference frequencies outside the pass-band so that phase comparator 90 receives the frequency in the best possible conditions, thus preventing the generating of intermodulation results possibly present in the control band of the loop and consequently at the output of the transmitter. The effective extent $B_{70}$ of the filter is represented in dotted lines on the second diagram of FIG. 4, with $B_{70}$ being equal to 74 to 100 MHz.

The average transmitting frequency $F_S$ being determined and the intermediary frequency, the modulator 50 being fixed, the reference frequency supplied by a local oscillator or by a synthesizer 110 is selected to be equal to $F_{o1}=F_S-F_i$. This frequency is a pure frequency. Phase comparator 90 compares the phase (or the frequency) of the output signal of the filter 70 with the spectrum-line at pure frequency to frequency $F_{o1}$. The analog phase comparator generates a voltage $u_1$ proportional to the instantaneous phase difference between these two frequencies. Voltage $u_1$ thus represents, to within a tolerance of one d.c. component, the demodulated audiofrequency signal. The spectrum of this signal after filtering in the loop filter 100 is therefore a signal in the audiofrequency band. This signal is applied to the modulation input $e_1$ of the oscillator at the output frequency $F_S$, 10, this output oscillator being, furthermore, tuned in frequency through the intermediary of an input $e_2$ that allows to make up for slow drifts due for example to aging or temperature. The oscillator is thus phase locked. The pure reference frequency $F_{o1}$ does not introduce any interferences nor phase noise when it is produced by a synthesizer or a quartz oscillator. Consequently, any phase or frequency variation at the output of the intermediary frequency modulator 50 is transferred without any modification of noise or linearity characteristics to the output oscillator 10.

As has been indicated hereinabove, when an LC oscillator frequency controlled by varactors is used, the noise increases with frequency. The output signal of oscillator 10, although this oscillator has a frequency $F_S$ equal to 107 MHz, for example, has its noise suppressed by the phase locking loop and its noise level becomes equal to the level of the oscillator noise at 10.7 MHz. Of course, the loop filter 100 of the phase locking loop of the output oscillator must be calculated so as not to introduce the defects mentioned hereinabove by amplitude or phase variation, while performing sufficient filtration of the interferences outside the band. To meet this condition, filter 100 is a band rejection filter.

This transmitter presents, beside a very low noise level (lower than 90 decibels below the level of the useful signal), other advantages:

the first lies in the utilization of an intermediary frequency modulator at fixed frequency, this modulator being able to be optimized as to its performances, due to the fact that the frequency swing is independent from the transmitting frequency of the channel selected;

the second advantage is the choice of the transmitting frequency of the output channel by simply changing the reference frequency at the input of phase comparator 90. Since this frequency is generated by a synthesizer or by a quartz oscillator it also allows to contribute to a reduction of the phase noise of the output signal.

Furthermore, as indicated hereinabove the suppression of the noise of the output oscillator by the linear phase locking loop in the control band and the filtering of the interferences appearing outside the control band of this loop, in particular, the harmonics of the intermediary frequency of the modulator or the results of beat at the output of rejection mixer 40, also allowing to contribute to a good spectral purity of the output oscillator.

Also, as indicated above, an amplifier 120 is mounted in parallel to incorporate in the transmitter a function of control of the main characteristics of the transmitter, since the demodulated audiofrequency signal appears, to within a tolerance of the loop corrections, at the input of output oscillator 10.

Figure 5:
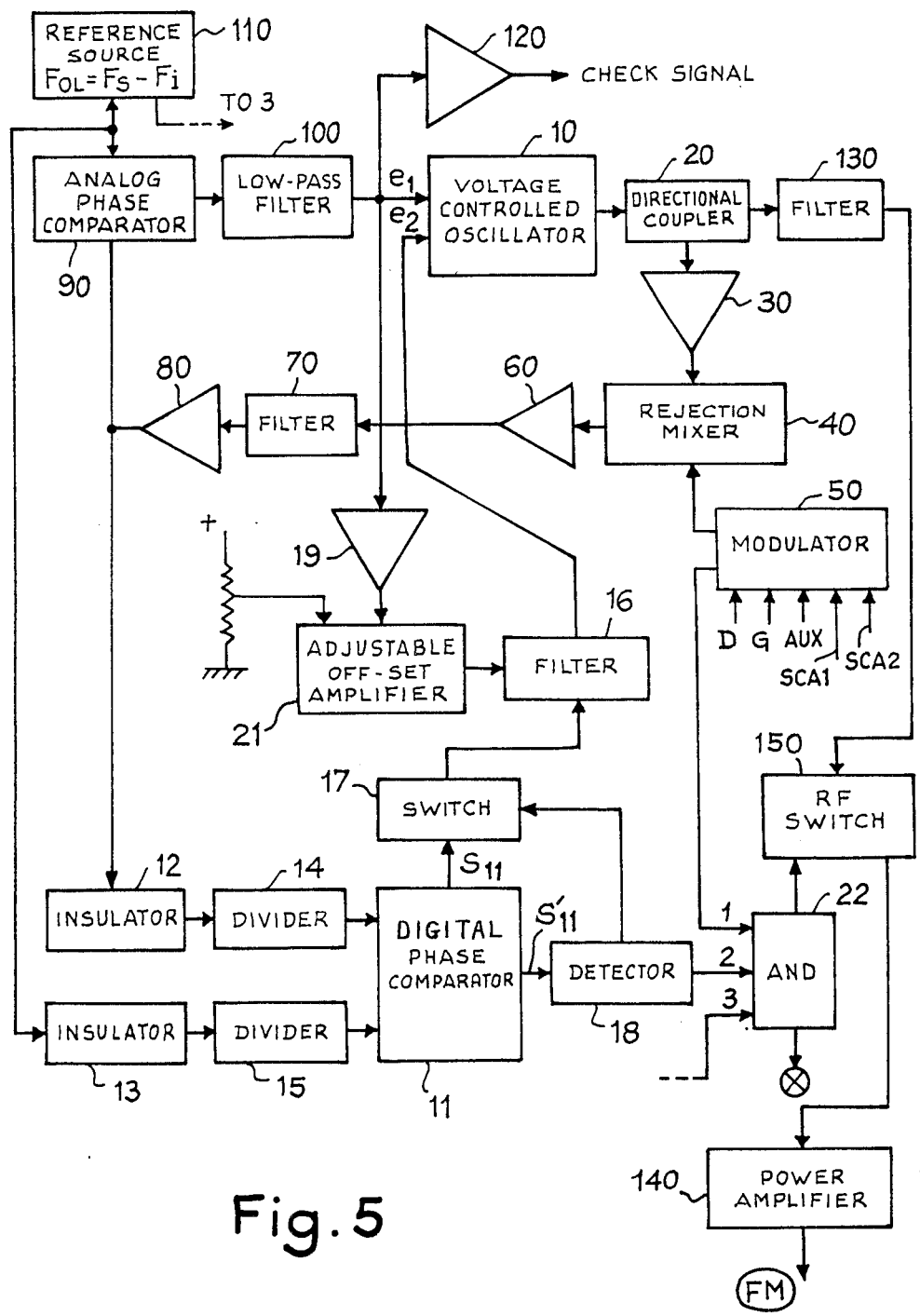
FIG. 5 is a block diagram of an emitter or transmitter according to the invention, comprising a digital loop for automatic positioning, as well as a frequency holding circuit.

The transmitter thus described can be improved. In fact, during application of voltage or during a change of frequency of the output channel, the analog loop that allows the modulation of the output oscillator is unlocked, since its interception range is small (about 500 KHz) with respect to the total width of the MF band (21 MHz). The improvement therefore consists in providing a digital phase locking and frequency holding loop, for the average frequency of output oscillator 10, connected to the control input $e_2$. FIG. 5 represents such a transmitter. The same elements as those shown on FIG. 1 have been designated by the same references.

The role of the digital loop and of the holding circuit used in this transmitter is to control that the analog phase locking loop of the output oscillator 10 operates indeed withiin its interception range, so as to obtain an automatic frequency adjustment of the output oscillator in case of frequency modification, to maintain the locking action of this analog loop independently from possible drifts of the characteristics of the elements due to aging or temperature variation, and furthermore to realize a centered modulation adjustment with respect to the interception range of the phase locking loop with a view to obtaining maximum dynamics of the demodulated signal.

This loop is constituted as follows: the output of reference source 110 and the output of insulating amplifier 80 provided in the phase locking loop upstream of the phase comparator 90, are respectively connected to two inputs of a digital phase comparator 11, through the intermediary of insulators, respectively 12 and 13, followed by dividers, respectively 14 and 15. Dividers 14 and 15 are high speed dividers, having identical rates, that divide the frequency $F_{o1}$ supplied by the local oscillator and the frequency of the signal $F_S-F_i$ supplied by the pass-band filter 70, in order to bring them back to about 500 KHz. Phase comparator 11 (or frequency discriminator) supplies at its output $S_{11}$ a digital signal applied to the input of a loop filter 16 through the intermediary of a switch 17. Loop filter 16 integrates the signal in the phase comparator output 11, and applies it to the control input $e_2$ of output oscillator 10. The control voltage thus applied maintains the condition of equality of frequency and constant phase shift between reference frequency $F_{o1}$ and frequency $F_S-F_i$ at amplifier output 80. When the equality condition is verified, the phase comparator supplies on a complementary output $S'_{11}$ a logic signal of level 1 applied to the input of a detector 18 called locking detector. This detector is a peak limiter detector the time constant of which is determined in order to integrate the residual pulses due to a non zero phase shift between the two frequencies present at the inputs of phase comparator 11. This locking detector supplies a logic signal of level 0 applied to the control input of analog switch 17. Therefore, detection of the locking condition causes switch 17 to be turned off. This disconnection of the digital loop is necessary in normal operating conditions to avoid an interaction of this digital loop with the analog loop, which would create a locking instability of the analog loop. In order to maintain the control voltage at input $e_2$ at value $u_2$ corresponding to the average frequency of the output channel at the moment of disconnection of the digital loop, a holding circuit is provided, which is constituted by an insulating amplifier 19 the input of which is connected to the output of filter 100, and the output of which is connected to an adjustable OFF-SET operational amplifier 21. The output of this amplifier 21 is connected to a second input of loop filter 16. The average value $u_1$ of the direct voltage applied to the input $e_1$ of the output oscillator 10, is selected so that after multiplication by the gain of the holding chain constituted by amplifiers 19, 21, the loop filter generates the same voltage $u_2$.

Loop filter 16 allows in both cases, i.e. locking and holding (maintaining), to eliminate any audiofrequency modulation able to appear at its output in order to preserve simply the direct voltage. This filter thus allows the elimination of any eventual "counter-modulation" that might be initiated in the output oscillator 10 by the control input $e_2$. The gain of d.c. holding chain is very high, practically equal to that of the loop filter 16, and the average direct voltage $u_1$ at the output of the analog phase comparator 90 is held at a very low value. Any slow drift of the output oscillator 10 is thus automatically compensated by this holding circuit. The direct OFF-SET voltage applied to the operational amplifier 21 allows to center the modulation by changing the direct voltage $u_1$ at the output of the phase analog comparator.

This figure represents the output filter 130 and the power amplifier stage 140 connected by a switch of the radiofrequency signal 150. It is therefore possible to prevent transmitting the signal when transmission is not carried out under normal conditions. With this aim, the radiofrequency switch 150 is controlled by the output signal of an AND-gate 22. This AND-gate receives on three inputs characteristic data of the operation of the transmitter. Its first input 1 is connected to an output of the modulator at intermediary frequency 50 which supplies a signal of logic level 1 when the locking loop of the modulator is effectively locked. A second input 2 receives data from a supplementary output of the locking detector 18, and a third input receives from the frequency synthesizer 110 a third set of locking data. When these three sets of data are present, level 1 appears at the output of the AND-gate and controls cutting radiofrequency switch 150, with PIN diodes. When the switch is cut off, the modulated signal at the transmitting frequency is applied to the power stages 140 at the transmitter output. These precautions prevent transmitting outside the FM band in the case of unlocking one of the loops of the transmitter. A locking luminous pointer, for example, a light-emitting diode, LED, can be connected to the AND-gate 22 to indicate the state of the system.

The present system is not limited to the embodiments described and represented hereinabove. Modifications of details of the transmitter, for example a different choice of the frequency beat selected for the locking of the analog loop, or modifications in the digital locking loop of the central frequency $F_S$ or in the holding circuit, do not depart from the scope and spirit of the present invention.

We claim:

1. Frequency modulation transmitter comprising:
    an output oscillator centered on a central frequency $F_S$ of a transmitting channel, the output oscillator having at least one modulation input and an output, a modulation signal being applied to the modulation input through an intermediary frequency of a phase-locking loop, the phase-locking loop including:
    a mixer having a first input connected to the output of the oscillator and a second input connected to the output of a modulator, the modulator having a central intermediary frequency $F_i$, the frequency of the central intermediary frequency $F_i$ being much smaller than the central frequency of the transmitting channel, the modulator further receiving an information modulation signal;
    a band pass filter having an input connected to the output of the mixer, the band pass filter further having a band width equal to the band width of the output oscillator, the frequency of the band pass filter being shifted from the central intermediary frequency of the modulator;
    an analog phase comparator having a first input connected to the output of the band pass filter and a second input coupled to a stable reference frequency source, the source having a frequency beat between the central transmitting frequency and the central intermediary frequency; and
    a low pass filter having an input coupled to the output of the comparator and an output connected to the modulation input of the oscillator.

2. Frequency modulation transmitter according to claim 1,
    wherein the mixer is a rejection mixer for rejecting one of the beat frequencies resulting from the mixing of respective output signals of the oscillator and the modulator; and
    wherein, given a reference frequency $F_S - F_i$, the rejected beat frequency is $F_S + F_i$, $F_S$ being the central transmitting frequency and $F_i$ being the central intermediary frequency.

3. Frequency modulation transmitter according to claim 2, wherein the modulator comprises an intermediary frequency oscillator, the voltage of the intermediary frequency oscillator being simultaneously controlled by the information modulation signal and a second phase-locking loop having a quartz reference oscillator; whereby the central intermediary frequency in the modulator is held stable.

4. Frequency modulation transmitter according to claim 1, wherein the output oscillator comprises a control input for compensating the effect of drifts on the central transmitting frequency, the control input responding to a controlled voltage fed from a digital phase-locking loop, the digital phase-locking loop including a digital phase comparator having inputs connected to two inputs of an analog phase comparator through frequency dividers, a first output of the digital phase comparator being connected to the control input of the output oscillator through a switch and a low-pass filter, a locking detector being connected to a second output of the digital phase comparator, the state of the control input being established by a holding circuit including an adjustable off-set voltage amplifier having an output connected to the input of the low pass filter, the gain of the digital phase-locking loop influencing the controlled voltage applied to the control input of the output oscillator.

5. Frequency modulation transmitter according to claim 4, wherein the locking detector is further connected to the control input of a switch positioned in the output channel of the transmitter to interrupt any transmission for which the transmitting frequency of the transmitter is not locked into.

6. Frequency modulation transmitter according to claim 5, wherein each of the phase-locking loops has a controlled output connected to the input of an AND gate, the AND gate having output controls for controlling the switch positioned in the output channel of the transmitter.

* * * * *